(12) United States Patent
Lin

(10) Patent No.: US 6,445,052 B1
(45) Date of Patent: Sep. 3, 2002

(54) POWER LATERAL DIFFUSED MOS TRANSISTOR

(75) Inventor: Ming-Te Lin, Hsin-Chu Hsien (TW)

(73) Assignee: United Microelectronics Corp., Hsin Chu (TW)

( * ) Notice: Subject to any disclaimer, the term of this patent is extended or adjusted under 35 U.S.C. 154(b) by 0 days.

(21) Appl. No.: 09/754,353

(22) Filed: Jan. 5, 2001

(51) Int. Cl.[7] ............................... H01L 29/76
(52) U.S. Cl. ........................ 257/401; 257/343
(58) Field of Search ..................... 257/288, 341, 257/343, 401

(56) References Cited

U.S. PATENT DOCUMENTS

| | | | | |
|---|---|---|---|---|
| 5,440,151 A | * | 8/1995 | Crevel et al. ............... | 257/173 |
| 6,133,107 A | * | 10/2000 | Menegoli .................... | 438/306 |
| 2001/0015459 A1 | * | 8/2001 | Watanabe et al. ........... | 257/341 |

FOREIGN PATENT DOCUMENTS

JP  9-51085 A  * 2/1997  ......... H01L/27/146

* cited by examiner

*Primary Examiner*—Eddie Lee
*Assistant Examiner*—Allan R. Wilson
(74) *Attorney, Agent, or Firm*—Winston Hsu

(57) ABSTRACT

The present invention provides a power lateral diffused metal-oxide semiconductor (power LD MOS) transistor positioned in an active area of a substrate on a semiconductor wafer. The power LD MOS transistor has a source/drain, a first metal layer and a hexagonal-shaped gate. The first metal layer is positioned on a second dielectric layer, covering the first dielectric layer, the gate, and the surface of the substrate, and is electrically connected with the drain via a first plug. A hexagonal-shaped gate positioned on the substrate surrounds the drain, with a first end of the gate positioned on the first dielectric layer and a second end connecting with the source. A second metal layer positioned on the second dielectric layer electrically connects with the drain via a second plug.

5 Claims, 6 Drawing Sheets

US 6,445,052 B1

POWER LATERAL DIFFUSED MOS TRANSISTOR

BACKGROUND OF THE INVENTION

1. Field of the Invention

The present invention relates to a metal-oxide semiconductor (MOS) transistor, and more particularly, to a power lateral diffused MOS transistor.

2. Description of the Prior Art

Metal-oxide semiconductor (MOS) transistors are widely used in the semiconductor industry due to their high integration and low consumption of power. When a proper voltage is inputted, MOS transistors can be used as a kind of switch to control the flow of electricity through a device. In high voltage circuits, such as the input and output terminals of electrical equipment, LD MOS transistors are commonly used because of their ability to withstand heavy loads. As development of integrated circuits progresses, control of the manufacturing process of LD MOS transistors becomes an increasingly important issue.

Please refer to FIG. 1 of the cross-sectional view of the structure of a power LD MOS transistor 11 according to the prior art. The power LD MOS transistor 11 is positioned on the surface of a silicon substrate 12, having a P-well 22 and an N-well 24, of a semiconductor wafer 10. The power LD MOS transistor 11 has a gate layer 38, positioned on a predetermined area on the surface of the silicon substrate 12, a field oxide layer 26, positioned on the surface the silicon substrate 12 and underneath one side of the gate layer 38. The gate layer 38 has a gate field oxide layer 29 and a gate conductive layer 31. Two doped areas 34 and 36 are positioned on the surface of the silicon substrate 12, located adjacent to the gate layer 38 and the field oxide layer 26, respectively.

Please refer to FIG. 2 of the top view of the layout of the power LD MOS transistor 11 according to the prior art. In order to prevent accelerated device breakdown caused by the tip effects due to high electrical field, tips in junctions need to be avoided. Thus, the power LD MOS transistor 11 is often structurally designed in the shape of a circle (as shown in FIG. 2) or in the shape of a rectangle with two opposing rounded edges, as shown in FIG. 3 of the top view of the layout of another embodiment of a power LD MOS transistor according to the prior art.

For a function chip or a system on chip (SOC), the operational voltage differs in respect to product requirement. However, raising the bearable value of threshold voltage and current of the power LD MOS according to the prior art can only be accomplished by increasing the channel width through enlargement of the radius or the longitude of the power LD MOS, as shown in FIG. 2 and FIG. 3. Thus, the integration and the utilization of the area of the wafer are seriously decreased.

SUMMARY OF THE INVENTION

It is therefore a primary object of the present invention to provide a novel structure for the power lateral diffused metal-oxide semiconductor (power LD MOS) transistor with more efficient utilization of the area of a wafer.

In the preferred embodiment of the present invention, a LD MOS transistor is positioned in an active area of a substrate on a semiconductor wafer. The power LD MOS transistor has a source/drain, a first metal layer, a hexagonal-shaped gate, a first plug, a first dielectric layer, a second dielectric layer, a second metal layer, a third dielectric layer and a second plug. The first metal layer is positioned on a second dielectric layer and covers the first dielectric layer, the gate, and the surface of the substrate, and electrically connects with the drain via a first plug. The hexagonal-shaped gate, surrounding the drain, has a first end positioned on the first dielectric layer and a second end connecting with the source. The first dielectric layer is positioned outside the active area of the substrate. The second dielectric layer covers the first dielectric layer, the gate, and the surface of the substrate. The third dielectric layer covers both the second dielectric layer and the first metal layer. The second metal layer is positioned on the third dielectric layer and electrically connects with the drain via a second plug.

It is an advantage of the present invention over the prior art that by positioning multiple power LD MOS transistors in parallel, the channel width can be efficiently increased to raise the bearable values of threshold current and operational voltage without sacrificing integration. The hexagonal-shaped structure of the power LD MOS transistor provided in the present invention is cost-effective since it optimally utilizes the wafer area. As well, the manufacturing process of the present invention is compatible to that of CMOS or SOC and thus the product is much more competitive in the market.

These and other objectives of the present invention will no doubt become obvious to those of ordinary skill in the art after reading the following detailed description of the preferred embodiment, which is illustrated in the multiple figures and drawings.

DETAILED DESCRIPTION OF THE PREFERRED EMBODIMENT

Figure 1:
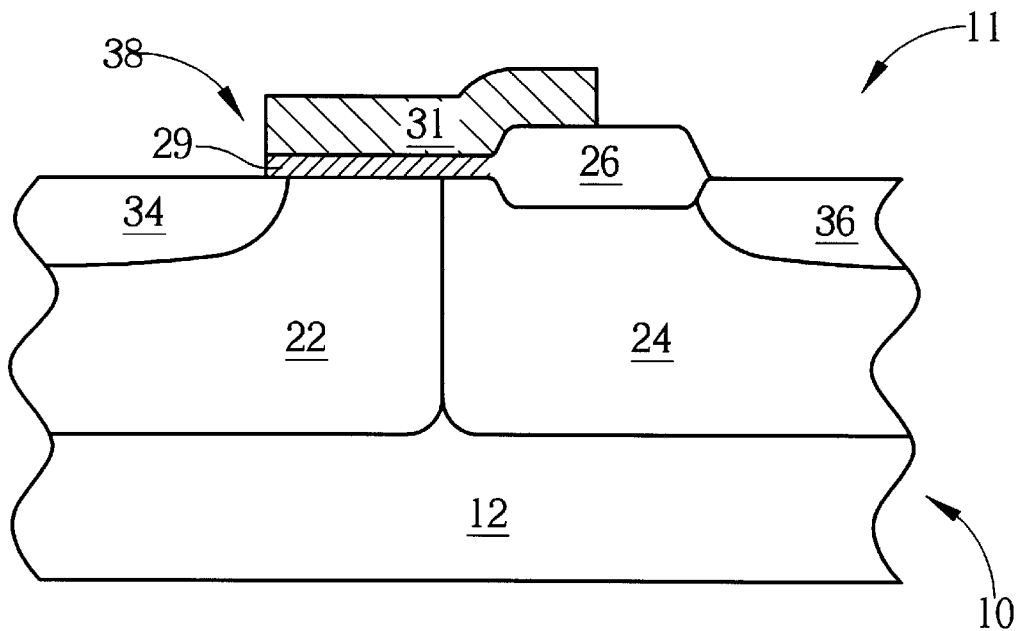
FIG. 1 is the cross-sectional view of the structure of a power LD MOS transistor according to the prior art.
Figure 2:
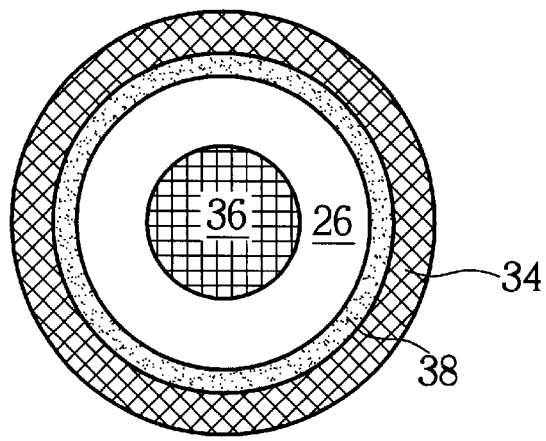
FIG. 2 is the top view of the layout of a power LD MOS transistor according to the prior art.
Figure 3:
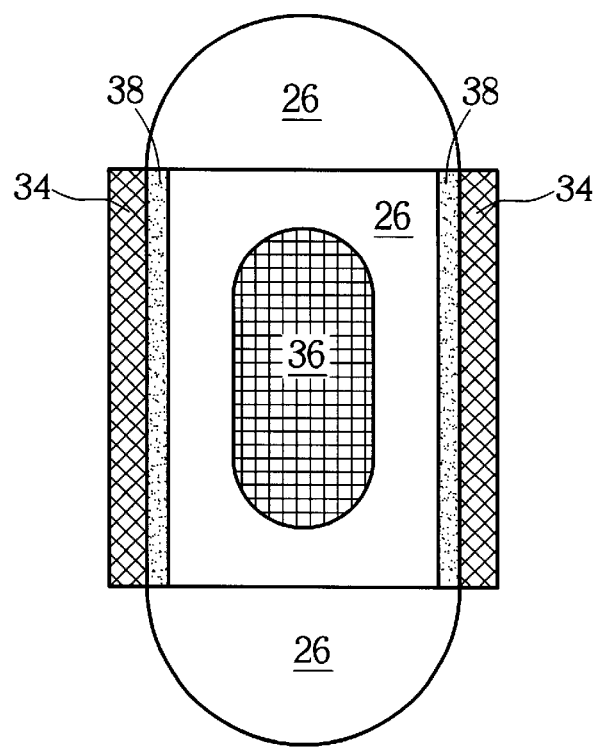
FIG. 3 is the top view of the layout of another embodiment of a power LD MOS transistor according to the prior art.
Figure 4:
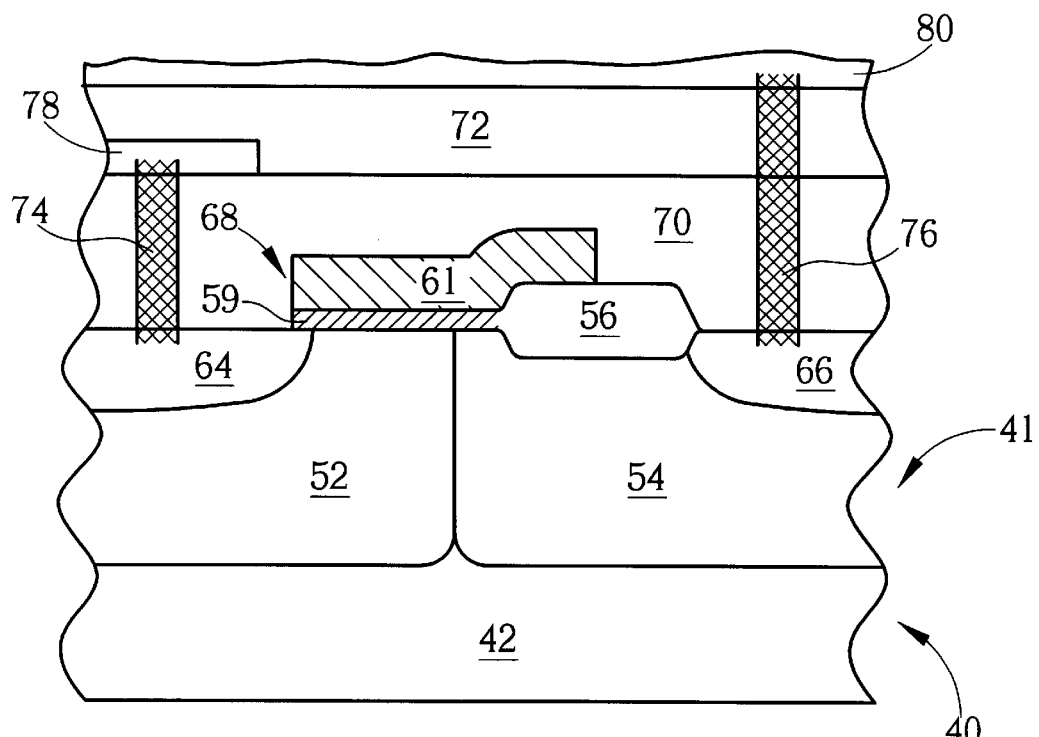
FIG. 4 is the cross-sectional view of the structure of a power LD MOS transistor according to the present invention.
Figure 5:
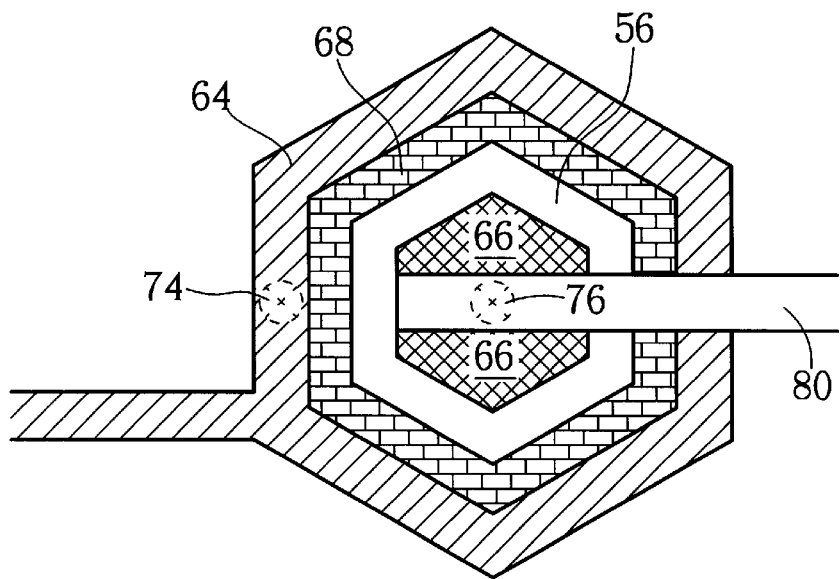
FIG. 5 is the top view of the layout of a power LD MOS transistor according to the present invention.

Please refer to FIG. 4 and FIG. 5 of the cross-sectional view of the structure and the top view of the layout, respectively, of a power lateral diffused metal-oxide semiconductor (power LD MOS) transistor 41 according to the present invention. The power LD MOS transistor 41 is positioned on the surface of a semiconductor wafer 40. On the semiconductor wafer 40 is positioned a P-type silicon substrate 42, a power LD MOS transistor 41, and a first dielectric layer 56 made of a field oxide layer. On the surface of the silicon substrate 42 and underneath one side of a gate layer 68 of the power LD MOS transistor 41, is a P-well 52 adjacent to an N-well 54. Two doped areas 64 and 66 function as a source and a drain of the power LD MOS transistor 41, respectively. The P-well 52 is optional according to the requirement of the circuit design or the device property.

As shown in FIG. 4, the gate layer 68 has a gate oxide layer 69 and a gate conductive layer 61. The semiconductor wafer 40 also has a second dielectric layer 70, the gate layer 68, the first dielectric layer 56 and the silicon substrate 42, respectively, on its surface. A third dielectric layer 72 covers the second dielectric layer 70 and a hexagonal-shaped first metal layer 78 surrounds the surface of the first dielectric layer 56 and electrically connects with the source 64 of the power LD MOS transistor 41 via a first plug 74. A second metal layer 80, positioned on the surface of the second dielectric layer 70, electrically connects with the drain 66 of the power LD MOS transistor 41.

Figure 6:
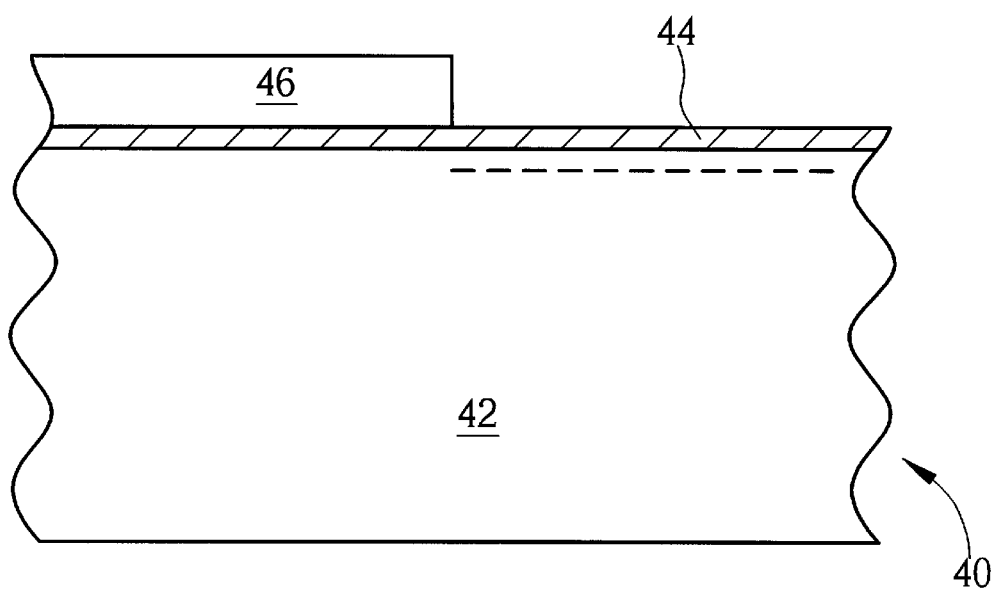
FIG. 6 to FIG. 10 are the cross-sectional diagrams of the manufacturing of a power LD MOS transistor according to the present invention.

Please refer to FIG. 6 to FIG. 10 of the cross-sectional diagrams of manufacturing a power LD MOS transistor according to the present invention. As shown in FIG. 6, the semiconductor wafer 40 is first placed into a thermal oxidation furnace, and a thermal oxidation process is performed to grow a silicon oxide layer 44, around 200 to 400 angstroms thick, on the surface of the silicon substrate 42. The silicon oxide layer 44 serves as a sacrificial oxide layer in a subsequent ion implantation process to increase the scattering of ions so as to prevent channeling. The silicon oxide layer 44 also functions as a pad oxide layer to promote adherence between a subsequent silicon nitride 50 layer and the silicon substrate 42.

Figure 7:
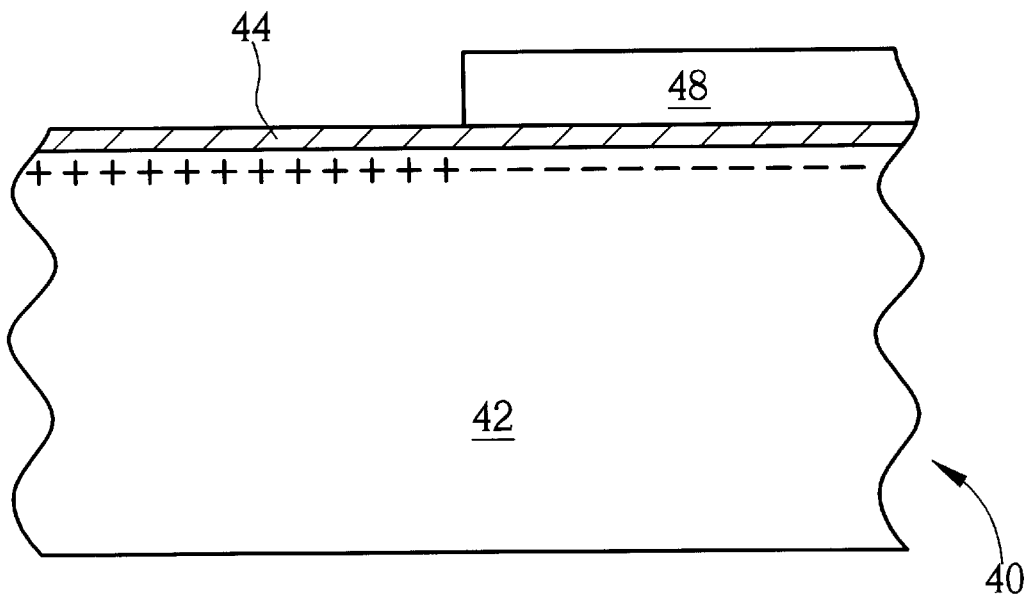

A photoresist layer 46 is coated onto the semiconductor wafer 40, and a lithographic process is performed to define the ion implantation area of the N-well 54. An ion implantation process is performed to dope the semiconductor wafer 40 with N-type dopants. The photoresist layer 46 is then stripped. As shown in FIG. 7, the steps described above are again performed to form a photoresist layer 48 and to define the ion implantation area of a P-well 52. P-type dopants are implanted into the semiconductor wafer 40 and the photoresist layer 48 is then stripped.

Figure 8:
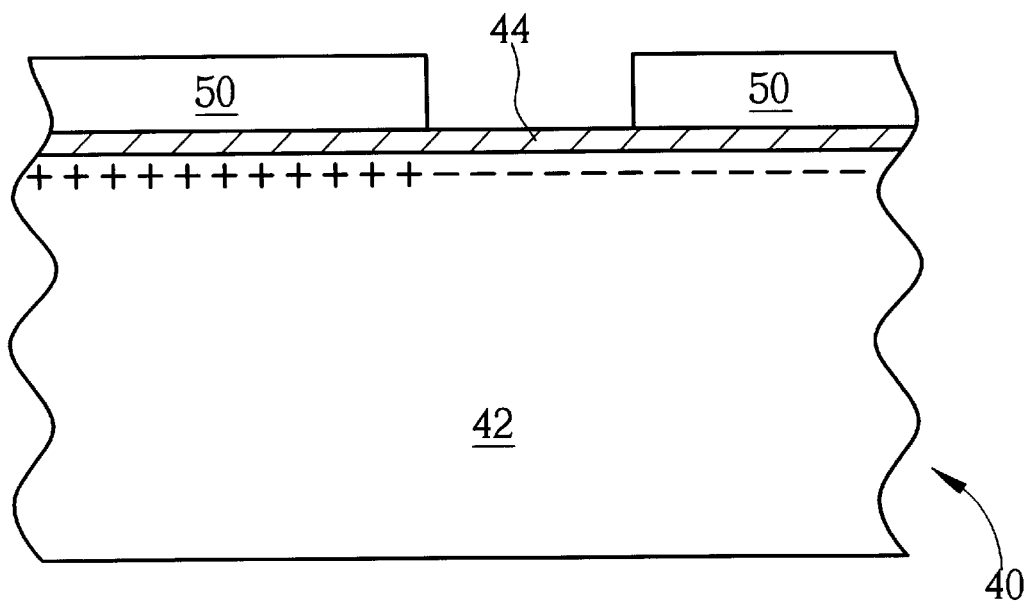
Figure 9:
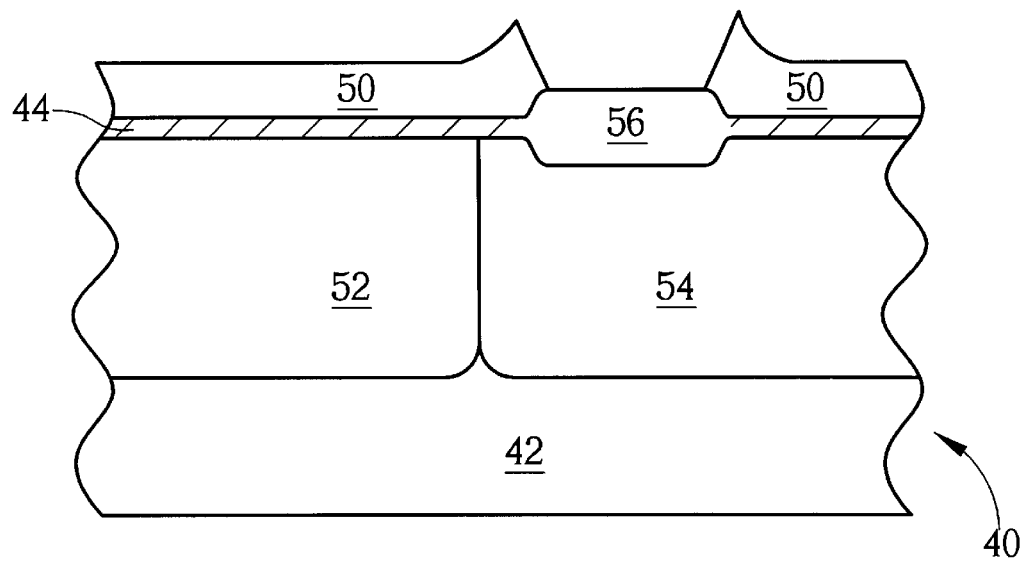

As shown in FIG. 8, a thin film deposition process is performed using a chemical vapor deposition (CVD) process to form a silicon nitride layer 50 on the semiconductor wafer 40. Then, a lithographic process is performed to define an area that is predetermined for the formation of a field oxide layer. A dry etching process is performed to remove the silicon nitride layer 50 in the predetermined area. The silicon nitride layer prevents the diffusion of oxygen and water, and is thus used as a mask in a local oxidation of silicon (LOCOS) process of forming the field oxide layer. As shown in FIG. 9, a wet oxidation process is performed to grow the field oxide layer 56 in the presence of water and oxygen. Simultaneously, a thermal diffusion is used to drive both the p-type and n-type dopants into the silicon substrate 42 so as to form the P-well 52 and the N-well 54. The silicon nitride layer 50 is then stripped using a heated phosphoric acid solution.

Figure 10:
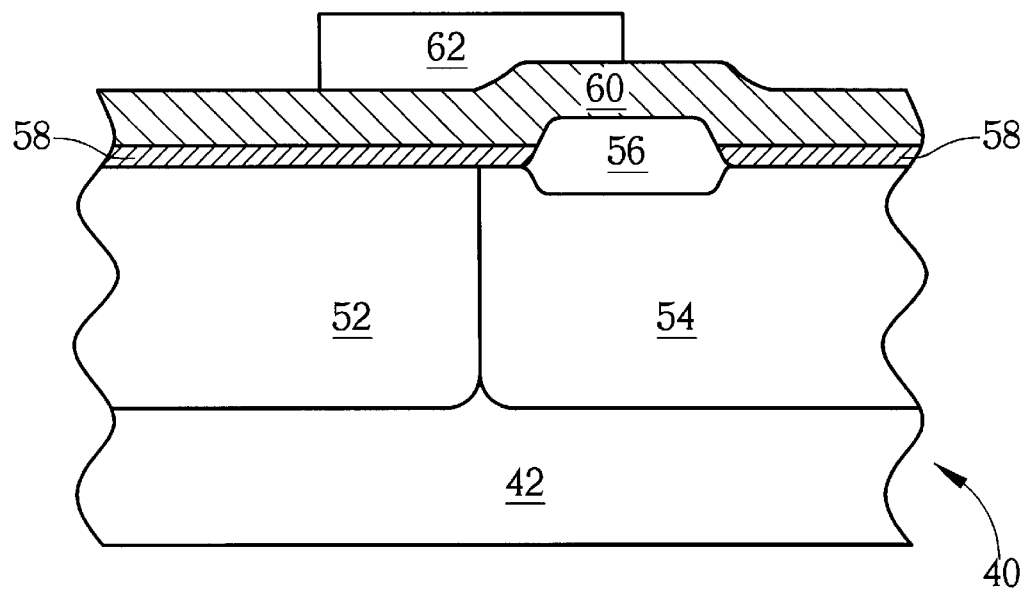

As shown in FIG. 10, the gate oxide layer 59 and the gate conductive layer 61 of the power LD MOS transistor 41 are next formed. The residual silicon oxide layer 44 is completely removed using a wet etching process. Then, the silicon surface, having undergone atmospheric exposure, is cleaned to ensure its quality. After performing the cleaning process, the semiconductor wafer 40 is again placed into the thermal oxidation furnace to form a silicon oxide layer 58, around 100 to 250 angstroms thick, on the active area using a dry oxidation process. A polysilicon layer 60, around 2000 to 3000 angstroms thick, is deposited on the silicon oxide layer 58 using an LPCVD process. A thermal diffusion method, or an ion implantation process, is then performed to highly dope the polysilicon layer 60 so as to reduce its resistivity. The polysilicon layer 60 is utilized as the subsequent gate conductive layer 61. A lithographic process is then performed to define the area of the gate layer 68 using a photoresist layer 62.

A dry etching process is performed to remove both the polysilicon layer 60 and the silicon oxide layer 58 that are not within the area of the gate layer 68, followed by the stripping of the photoresist layer 62. The residual polysilicon layer 60 forms a gate conductive layer 61, and the residual silicon oxide layer 58 forms a gate oxide layer 59. The gate layer 68 comprises the gate oxide layer 59 and the doped polysilicon gate conductive layer 61, as in the power LD MOS transistor shown in FIG. 4. Both a lithographic process and an ion implantation process are performed on the P-well 52 and the N-well 54 to form the N-type highly doped regions 64 and 66 which function, respectively, as the source and the drain of the semiconductor wafer 41.

Figure 11:
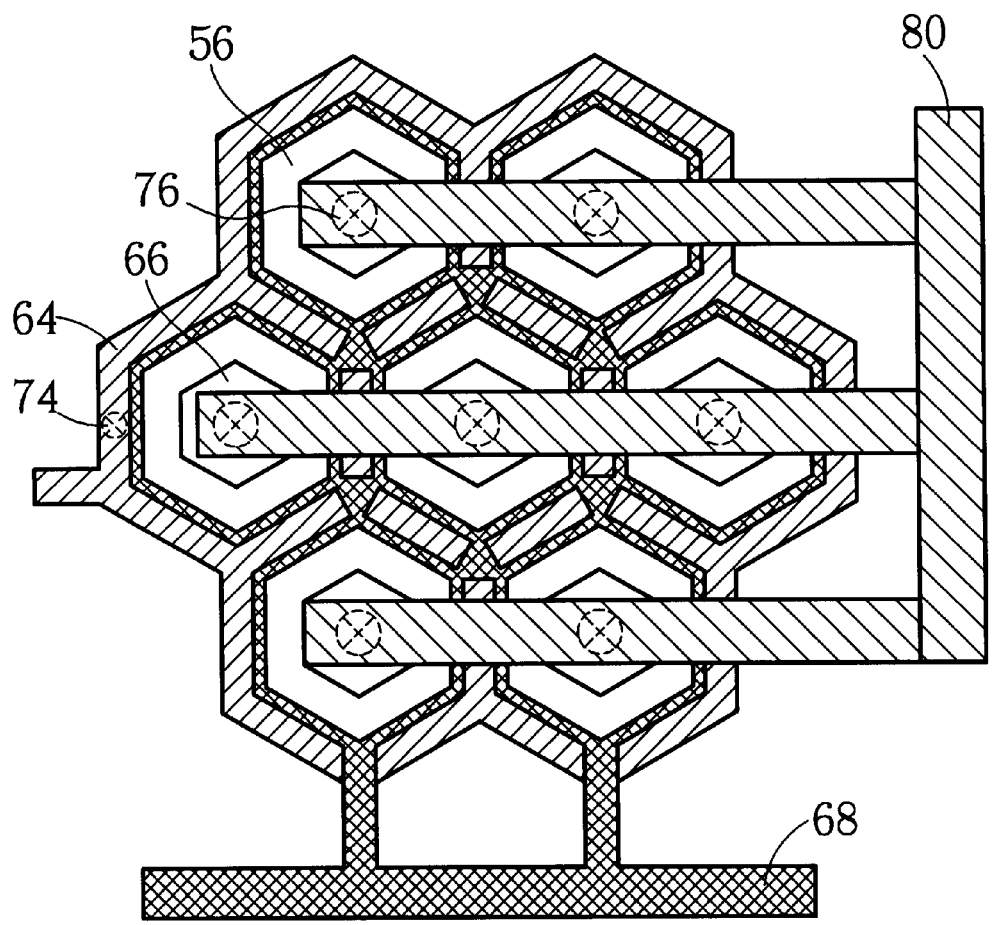
FIG. 11 is the top view of the parallel structure of power LD MOS transistors according to the present invention.

The present invention provides a hexagonal-shaped power LD MOS transistor structure that optimally utilizes the area of the semiconductor wafer, with the manufacturing process comparable to that of a function chip or a system on chip (SOC). As well, the channel width of the power LD MOS transistor can be efficiently increased to raise the bearable threshold current by positioning multiple power LD MOS transistors in parallel, as shown in FIG. 11. Therefore, in comparison with the prior art, the integration of the semiconductor is not sacrificed for an enlarged channel width.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A lateral diffused metal-oxide semiconductor (MOS) transistor, the MOS transistor positioned in an active area of a substrate on a semiconductor wafer, the MOS transistor comprising:

at least two doped regions positioned in the substrate, a first doped region and a second doped region, respectively, the first doped region functioning as a source of the MOS transistor, and the second doped region functioning as a drain of the MOS transistor;

a first dielectric layer positioned outside the active area of the substrate;

a hexagonal-shaped gate positioned on the substrate and surrounding the second doped region, with a first end of the gate positioned on the first dielectric layer and a second end connecting with the first doped region;

a second dielectric layer covering the first dielectric layer, the gate, and the surface of the substrate;

a first plug positioned in the second dielectric layer, and electrically connecting with the first doped region in the substrate;

a first metal layer positioned on the second dielectric layer, corresponding to a position bordering the hexagonal-shaped gate, and electrically connecting with the first doped region via the first plug;

a third dielectric layer covering both the second dielectric layer and the first metal layer;

a second plug positioned through the third dielectric layer and the second dielectric layer, and electrically connecting with the second doped region in the substrate; and a second metal layer positioned on the third dielectric layer, and electrically connecting with the second doped region via the second plug.

2. The MOS transistor of claim 1 wherein the MOS transistor is used as a power supply switch with the ability to load high voltage input.

3. The MOS transistor of claim 1 wherein the first doped region is hexagonal-shaped, and electrically connects with the first metal layer via a plurality of first plugs.

4. A lateral diffused metal-oxide semiconductor (MOS) transistor, the MOS transistor positioned in an active area of a substrate on a semiconductor wafer, the MOS transistor comprising:

- at least two doped regions positioned in the substrate, a first doped region and a second doped region, respectively, the first doped region functioning as a source of the MOS transistor, and the second doped region functioning as a drain of the MOS transistor;
- a first dielectric layer positioned outside the active area of the substrate;
- a hexagonal-shaped gate positioned on the substrate and surrounding the second doped region, with a first end of the gate positioned on the first dielectric layer, and a second end connecting with the first doped region;
- a second dielectric layer covering the first dielectric layer, the gate, and the surface of the substrate;
- a plurality of first plugs positioned in the second dielectric layer, and electrically connecting with the first doped region in the substrate;
- a second plug positioned in the second dielectric layer, and electrically connecting with the second doped region in the substrate;
- a first metal layer positioned on the second dielectric layer, corresponding to a position bordering the hexagonal-shaped gate, and electrically connecting with the first doped region via the first plugs;
- a third dielectric layer covering both the second dielectric layer and first metal layer;
- a third plug positioned in the third dielectric layer, and electrically connecting with the second doped region via the second plug; and
- a second metal layer positioned on the third dielectric layer, and electrically connecting with the second doped region via the second plug.

5. The MOS transistor of claim 4 wherein the MOS transistor is used as a power supply switch with the ability to load high voltage input.

* * * * *